United States Patent [19]

Holcomb et al.

[11] Patent Number: 4,998,217

[45] Date of Patent: Mar. 5, 1991

[54] SWEEP GENERATOR LINEARIZATION SYSTEM AND METHOD

[75] Inventors: Don R. Holcomb, Scottsdale; Thomas J. Hoppal, Gilbert; Mark J. Brown, Phoenix; Lawrence R. Schumacher, Mesa, all of Ariz.

[73] Assignee: Motorola, Inc., Schaumburg, Ill.

[21] Appl. No.: 345,745

[22] Filed: May 1, 1989

[51] Int. Cl.⁵ ............................................ G01R 23/16
[52] U.S. Cl. ................................... 364/573; 364/484; 324/77 B; 331/4; 331/44
[58] Field of Search ........... 364/573, 484, 485, 571.01, 364/570; 324/77 B, 77 C, 77 CS, 79 D, 79 R; 331/4, 44, 177 R, 178

[56] References Cited

U.S. PATENT DOCUMENTS

| | | | |
|---|---|---|---|
| 4,499,435 | 2/1985 | Thomson et al. | 331/4 X |
| 4,603,305 | 7/1986 | McCune | 331/4 |
| 4,611,164 | 9/1986 | Mitsuyoshi et al. | 364/485 X |
| 4,677,394 | 6/1987 | Vollmer | 331/44 X |
| 4,715,001 | 12/1987 | Deem et al. | 364/484 |
| 4,799,020 | 1/1989 | English | 324/79 R |
| 4,839,582 | 6/1989 | Fukaya et al. | 324/77 B |
| 4,839,583 | 6/1989 | Takano et al. | 324/77 B |

Primary Examiner—Parshotam S. Lall
Assistant Examiner—Michael Zanelli
Attorney, Agent, or Firm—Maurice J. Jones

[57] ABSTRACT

Microprocessor (MPU) controlled voltage controlled oscillator (VCO) linearization circuitry locks the VCO at desired low, center and high frequencies ($F_1$, $F_c$ and $F_h$) and measures the magnitudes of the corresponding control voltages ($V_1$, $V_c$ and $V_h$). Next, the VCO is swept at a nominal clock frequency to determine the times ($T_1$, $T_2$ and $T_h$) that the control voltages ($V_1$, $V_c$ and $V_h$) occur during the sweep cycle. The control voltage of the VCO is then swept at a first and then a second rate during a sweep cycle to assure that the center frequency ($F_c$) of the VCO occurs at the time ($T_c$) midpoint of the sweep cycle. As a result, each VCO frequency can be determined by MPU monitoring according to the time that the VCO frequency occurs during the sweep cycle. This circuitry is useful in spectrum analyzers for indirectly determining the otherwise unknown frequency of a received signal.

17 Claims, 3 Drawing Sheets

SWEEP GENERATOR LINEARIZATION SYSTEM AND METHOD

BACKGROUND OF THE INVENTION

The subject invention relates generally to waveform generator systems and methods. Particularly the invention relates to such systems and methods suitable for use in the sweep control circuitry of spectrum analyzers.

Modern electronics systems and particularly spectrum analyzers, for instance, sometimes require sweep systems wherein a signal having a continuously varying or "swept" frequency is applied to one input of a mixer so that another received signal applied to another input of the mixer can be sampled. The resultant sum or difference of the frequencies of these two input signals provides a mixer output signal having frequencies within a particular frequency band. The mixer input signal having a continuously varying frequency can be provided by a Voltage Controlled Oscillator (VCO) which includes a frequency determining circuit having a reactance with a magnitude that changes in response to changes in the magnitude of a control signal. More specifically, a varactor may be included in the VCO which changes capacitance in response to a control voltage having a changing magnitude. The control voltage magnitude can be in the form of a "sawtooth" waveform, for instance.

In some applications, such as those involving spectrum analyzers, it is desirable to determine the frequency of the VCO at least at selected times so that the frequency of the other input signal of the mixer can be determined. Direct measurement of the frequency of the VCO is too expensive for some commercial test equipment applications. Prior art indirect methods of determining the VCO frequency are complicated by the nonlinear voltage-to-capacitance characteristic of varactor diodes. The frequency-to-voltage characteristic for such diodes can be either concave or convex.

Moreover, prior art techniques of linearizing the frequency-to-voltage characteristic of such varactor diodes have generally only been successful over limited frequency ranges because of the complex nature of such characteristics. Linearization becomes impractical when it is desired to utilize the VCO over a wide frequency band and/or over a wide range of temperatures. More particularly, some prior art techniques utilize diodes providing analog junction voltages for compensation. The characteristics of such diodes also tend to drift with temperature. Furthermore, these analog linearization techniques often require that each VCO be individually compensated by testing personnel. Such manual alignment or calibration procedures are expensive and time-consuming.

Furthermore, even when prior art compensation is performed properly at a particular time, the characteristics of the VCO or other circuitry can change with age or with other factors and so it is necessary to periodically recalibrate. The accuracy of a spectrum analyzer can continuously deteriorate between these calibrations.

Another prior art solution to the above problems involves lookup tables embedded in a Read Only Memory (ROM) having fixed values programmed therein. This solution also cannot compensate for changes in system characteristics with time. Moreover, thermistors can be utilized in cooperation with the lookup table to compensate the system at various temperatures. However, this solution tends to be software intensive and can take up a great deal of microprocessor time. Furthermore, such techniques do not take into account electrical characteristics that change with age. Accordingly, the accuracy of such systems can also immediately start deteriorating after each calibration and after each recalibration.

SUMMARY OF THE INVENTION

Accordingly, it is an object of the present invention to provide a system and/or method for indirectly determining the frequency of a controllable oscillator.

Another object is to provide a system and/or method for controlling a variable frequency oscillator which is self calibrating for characteristic changes due to aging, changes in temperature, etc.

Still another object is to provide a system and/or method for controlling the amplitude of a waveform with time.

In one embodiment, control circuitry for linearizing the output frequencies of a VCO with time includes a first control circuit selectively coupled to a control terminal of the VCO. The first control circuit provides control voltages having magnitudes selected to operate the VCO at predetermined frequencies within a band of frequencies. These frequencies can be a frequency at the low end, at the center and at the high end of the band, for example. A measuring circuit is coupled to the VCO for determining the selected magnitudes of the control voltages corresponding to the predetermined frequencies. Next, an adjustable sweep generator is selectively coupled to the VCO for changing the magnitude of the control voltage for the VCO at a nominal frequency during a sweep cycle. A second control circuit which can include a microprocessor having a memory, is coupled to the adjustable sweep generator and to the VCO. The memory records the times when the magnitudes of the control voltages reach the selected magnitudes for operating the VCO at the predetermined frequencies. Next, the second control circuit selectively adjusts the frequency of the adjustable sweep clock generator so that the output frequency of the VCO reaches the center frequency at a time midway through the sweep cycle so that the output frequencies of the VCO tend to be predictable at given times during the sweep cycle.

The output of the VCO is suitable for operating a spectrum analyzer which is controlled by the microprocessor.

The above and other objects, features, and advantages of the present invention will be better understood from the following detailed description taken in conjunction with the accompanying drawings.

DETAILED DESCRIPTION OF THE PREFERRED EMBODIMENT

Figure 1:
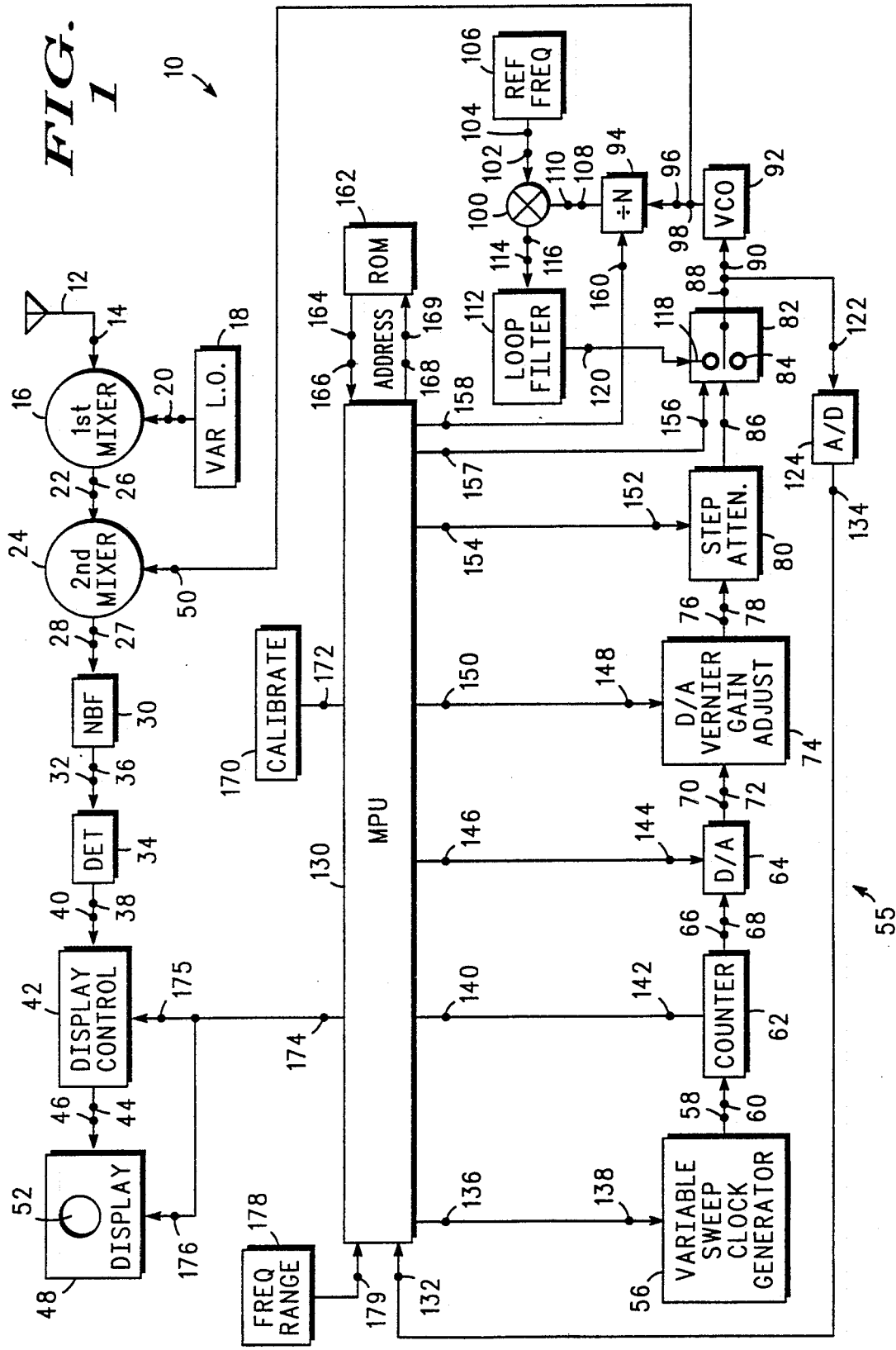
FIG. 1 is a block diagram of a frequency synthesizer.

FIG. 1 is a block diagram of a spectrum analyzer 10. An antenna 12 or other signal inputting means provides received signals to be studied or processed to first input terminal 14 of first mixer 16. Manually variable local oscillator 18 provides another input signal to second input terminal 20 of mixer 16. Input terminal 22 of second mixer 24 is connected to output terminal 26 of first mixer 16. Output terminal 27 of second mixer 24 is connected to input terminal 28 of narrowband filter 30. Input terminal 32 of detector 34 is connected to output terminal 36 of filter 30. Output terminal 38 of detector 34 is connected to input terminal 40 of display control circuitry 42 which has an output terminal 44 connected to input terminal 46 of display 48.

Input terminal 50 of second mixer 24 is adapted to receive a "swept frequency" or sweep which cyclically varies between predetermined upper and lower frequency limits. This frequency can vary from a predetermined lower limit to an upper limit in a continuously increasing, stair step fashion, for instance. Assuming that the frequency of the mixer sweep signal and the frequency of the received input signal provide a desired predetermined difference frequency at the output of second mixer 24 which falls within the pass band of filter 30, detector 34 and display controller 42 will process and pass the desired signal for display on a Cathode Ray Tube (CRT) 52 of display 48. In other applications, the sum of the frequencies of the received input signal and the output of the second mixer 24 could be utilized.

Sweep generator circuit 55 can be used to generate a Radio Frequency (RF) signal sweep of plus or minus 5 Megahertz (MHz) to plus or minus 10 kilohertz (KHz) about a desired center frequency of 0.4 MHz to 1000 MHz, for instance. Circuit 55 includes a variable frequency sweep clock generator 56 having an output terminal 58 which is connected to input terminal 60 of counter 62. Digital-to-Analog (D-to-A) converter 64 has an input terminal 68 connected to output terminal 66 of counter 62. Output terminal 70 of D-to-A 64 is connected to input terminal 72 of D-to-A vernier gain adjust circuit 74 which includes an output terminal 76 connected to input terminal 78 of step attenuator 80. Single-pole, double-throw switch 82, which can be provided in solid state form, includes a first input terminal 84 connected to output terminal 86 of attenuator 80 and an output terminal 88 connected to control terminal 90 of VCO 92. Variable divide-by-N circuit 94 includes an input terminal 96 connected to output terminal 98 of VCO 92. Phase detector 100 includes an input terminal 102 connected to output terminal 104 of stable reference frequency oscillator 106. Output terminal 108 of divide-by-N circuit 94 is connected to another input terminal 110 of phase detector 100. Loop filter 112 includes an input terminal 114 connected to output terminal 116 of phase detector 100. Second input terminal 118 of switch 82 is connected to output terminal 120 of loop filter 112. Circuits 94, 106, 100, 112 when connected to VCO 92 provide a phase locked loop (PLL) which locks VCO 92 at stable, predetermined frequencies which vary with "N" of circuit 94 in a known manner. Control terminal 90 of VCO 92 is also connected to input terminal 122 of Analog-to-Digital (A-to-D) converter 124.

Microprocessor (MPU) 130, which can be of a known type, includes a plurality of input and output terminals for respectively receiving and sending information and control signals relating to the control of spectrum analyzer 10. More specifically, terminal 132 is coupled to output terminal 134 of A-to-D 124 so that the amplitude of selected control voltages for VCO 92 can be provided to and stored in MPU 130. MPU terminal 136 is coupled to control terminal 138 of clock generator 56 to selectively vary the clock rate thereof. Generator 56 can include a programmable divide-by-N circuit to provide frequency adjustment. MPU terminal 140 is coupled to output terminal 142 of counter 62. Control terminal 144 of D-to-A 64 is coupled to MPU terminal 146. Control terminal 148 of gain adjust circuit 74 is coupled to MPU terminal 150.

Vernier gain adjust circuit 74 is utilized to enable fine tuning of the output of D-to-A 64 by microprocessor 130 so that the control voltages having desired magnitudes are applied to terminal 90 of VCO 92. Step attenuator control terminal 152 is coupled to MPU terminal 154. Control terminal 156 of electronic switch 82 is coupled to MPU terminal 157. MPU output terminal 158 is coupled to control terminal 160 of PLL divide-by-N circuit 94. ROM 162 includes output terminal 164 coupled to MPU terminal 166. MPU output terminal 168 is coupled to ROM input terminal 169. Calibrate initiation control function is performed by block 170 which is connected to MPU terminal 172. Block 170 can be a front panel switch which a user operates to initiate the calibration sequence, for instance. MPU output terminal 174 is connected to control terminal 175 of display control circuit 42 and to control terminal 176 of display 48. Frequency range controller 178, which cooperates with attenuator 80 to control sweep ranges and center frequencies, is connected to MPU control terminal 179.

Spectrum analyzer circuitry 10 of FIG. 1 utilizes MPU 130 to indirectly ascertain the precise frequency of VCO 92 when mixer 24 provides a received signal to display 48, by measuring the time elapsed from the beginning of a sweep cycle. Knowing the VCO frequency at the time the difference signal occurs at the output of mixer 27 and the difference frequency passed by filter 30 enables MPU 130 to determine the otherwise unknown frequency of the received signal. Circuitry 55 "linearizes" the frequency sweep provided at output terminal 98 of VCO 92 with respect to time and control voltage so that the frequency of the received signal can be determined by determining the time when the desired signal is encountered during a sweep cycle. To perform this function, circuitry 55 is calibrated by switch 82 being operated to a first or "phase-locked" position connecting terminal 88 to terminal 118. Next, switch 82 is operated to a second or "open loop" position wherein terminal 88 is connected to terminal 84 to complete the calibration procedure.

CALIBRATION

The calibration sequence can be initiated by either manually changing the frequency range by operation of circuits 80 and 178 or by operation of calibration block 170, for instance. Display 48 is rendered inoperative by MPU 130 during calibration of sweep generator 55. At the beginning of the calibration sequence, MPU 130 places VCO 92 in the phase locked condition by operating switch 82 to the first condition. Reference frequency oscillator 106 applies a reference signal to first input 102 of phase detector 100. This signal is compared to the output signal of divide-to-N circuit 94 to provide a control signal at phase detector output terminal 116. After filtering by filter 112, the control signal is applied to control terminal 90 of VCO 92. The output signal of VCO 92 at terminal 98 is divided by divide-by-N 94 and applied to second input terminal 110 of phase detector 100. Hence, the output frequency of VCO 92 is precisely controlled in a known manner to be "N" times the frequency of oscillator 106.

By controlling "N", MPU 130 adjusts the frequency of VCO 90 to be any one of a plurality of the multiples of the reference frequency provided by oscillator 106. Thus, over a particular frequency band of interest, as selected via ranging block 178 by an operator, MPU 130 controls "N" so that VCO 92 operates at a frequency at the center of the band ($F_c$), then at a frequency at the low end of the band ($F_l$) and then at a frequency at the high end of the band ($F_h$). These values of N for a band of interest can be obtained by MPU 130 from ROM 162, for instance. A-to-D 124 operates as a digital volt meter for measuring the magnitudes of the control voltages $V_l$, $V_c$ and $V_h$ at VCO control terminal 90 respectively corresponding to each of $F_l$, $F_c$ and $F_h$.

Figure 2:
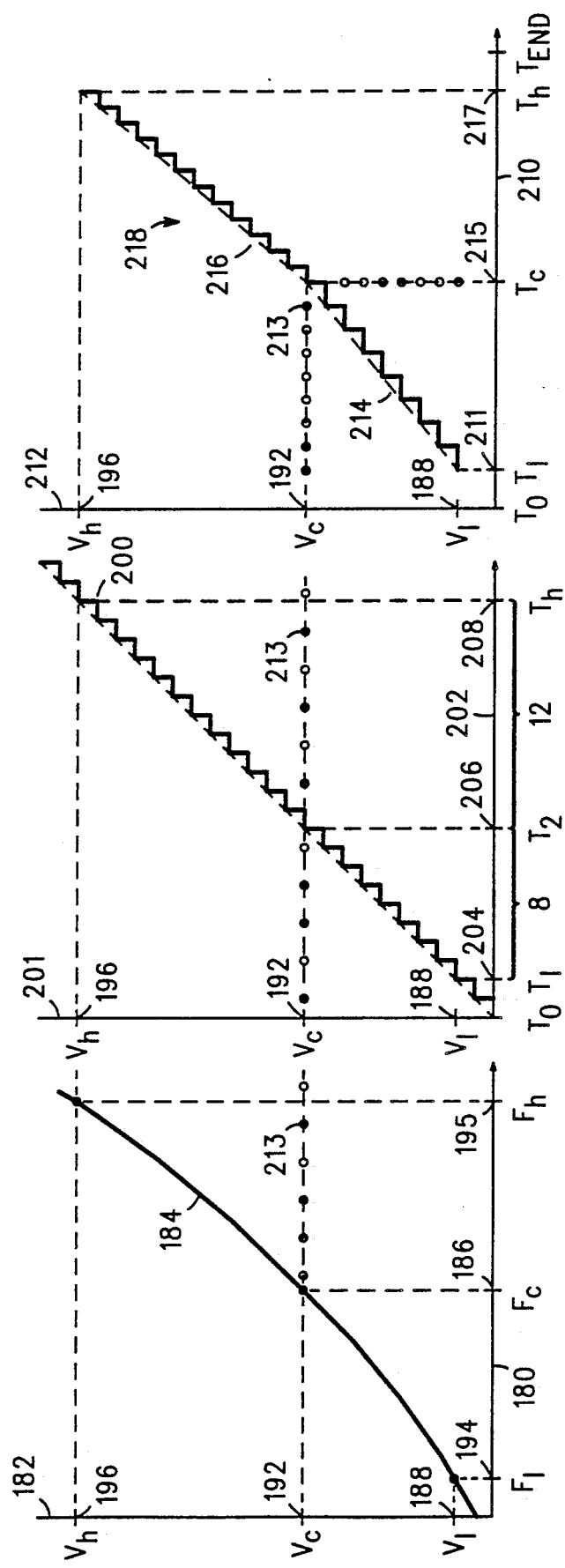
FIG. 2A is a graph of the nonlinear frequency versus VCO control voltage magnitude characteristic for the VCO shown in FIG. 1 and indicates measurements comprising the first step of the calibration method.
FIG. 2B is a graph of time in counts versus VCO control voltage magnitude for the counter of FIG. 1 running at a nominal frequency, which facilitates the second step in the calibration method.
FIG. 2C is a graph of time in counts versus VCO control voltage magnitude for the counter being run at two different frequencies which facilitates the last step and a resulting calibrated sweep control signal.

More particularly, referring to FIG. 2A, abscissa axis 180 indicates frequency and ordinate axis 182 indicates the magnitude of the control voltages required at control terminal 90 of VCO 92 to produce the corresponding frequencies. Curve 184 indicates the undesirable nonlinear relationship between the control voltage applied to control terminal 90 and the frequency of the output signal occurring at output terminal 98 of VCO 92.

The first step of the calibration method is initiated by MPU 130 programming divide-by-N circuit 94 such that N has the proper magnitude to cause VCO 92 to operate at $F_c$ as indicated by point 186 on abscissa axis 180. While VCO 92 is operating at $F_c$, MPU 130 stores the magnitude of the corresponding control voltage, $V_c$, as indicated by level 192 of ordinate axis 182. Next, MPU 130 changes "N" so that VCO 92 operates at ($F_l$) indicated by point 194 on abscissa axis 180 of FIG. 2A. A-to-D converter 124 again converts the resulting control voltage magnitude into a digital signal which is stored by MPU 130 as level $V_l$ as indicated by level 188 of FIG. 2A. Then MPU 130 again changes "N" to enable VCO 92 to provide the high frequency ($F_h$) as indicated by point 195 on abscissa axis 180. The corresponding control voltage ($V_h$), indicated by level 196 is also recorded in MPU 130.

To initiate the second step of the calibration sequence, MPU 130 operates switch 82 to the second position such that terminal 86 is connected to terminal 88. MPU 130 then instructs the divide-by-N circuit of the sweep clock generator 56 so that the generator 56 provides an output signal having a constant, nominal or average sweep frequency. Counter 62 counts each of the pulses from sweep generator 56 in a known manner to provide an increasing digital count at output 68. D-to-A 64 translates the outputs of counter 62 into a stair step voltage 200 of increasing magnitude as indicated in FIG. 2B. Ordinate axis 201 of FIG. 2B indicates the magnitude of the VCO control voltage and abscissa axis 202 measures sweep time. MPU 130 in cooperation with A-to-D 124 next notes the time, $T_l$ indicated by point 204 on abscissa 202 at which the control voltage on terminal 90 of VCO 92 corresponds to $V_l$, the time, $T_2$, indicated by point 206 when the control voltage on terminal 90 of VCO 92 corresponds to, $V_c$, and the time, $T_h$ indicated by reference number 208 at which the control voltage on terminal 90 corresponds to $V_h$. These times can be recorded in MPU 103 in terms of the corresponding number of counts. For instance, as shown in FIG. 2B, it takes 8 counts at the nominal frequency of generator 56 to change the control voltage from $V_l$ to $V_c$ and 12 counts to change the voltage from $V_c$ to $V_h$. This is because the frequency of VCO 92 changes more for a given change in voltage at low frequencies than at high frequencies, as shown by curve 184 of FIG. 2A.

Next, for the third step, MPU 130 is programmed by software to calculate a first counter frequency, $CF_1$ by the following formula, where NF=nominal frequency of clock 56:

$$CF_1 = \frac{\text{COUNTS }(T_1 \text{ to } T_2)}{1/2 \text{ COUNTS }(T_1 \text{ to } T_h)} \times NF = \frac{8}{10} NF$$

Then, the MPU 130 calculates a second counter frequency, $CF_2$ according to the following formula:

$$CF_2 = \frac{\text{COUNTS }(T_2 \text{ to } T_h)}{1/2 \text{ COUNTS }(T_1 \text{ to } T_h)} \times NF = \frac{12}{10} NF$$

These formulas are arranged to calculate frequencies for clock 56 so that the control voltage, $V_c$, for providing the center frequency, $F_c$, occurs at $T_c$ which is halfway or midway between the total count period between $T_l$ and $T_h$.

To illustrate the third step, FIG. 2C includes an abscissa axis 210 for measuring time and an ordinate axis 212 for measuring the magnitude of the control voltage for VCO 92. MPU 130 instructs variable sweep generator 56 to operate at 0.8 of the nominal frequency between times $T_l$, indicated by point 211, and time $T_c$, indicated by point 215, and to operate at 1.2 of the nominal frequency between times $T_c$ and $T_h$, as indicated by point 217. Accordingly, $T_c$ occurs at $F_c$, as indicated by dotted line 213 of FIGS. 2A, B and C, rather than at $T_2$ of FIG. 2B. Thus, characteristic 214 of FIG. 2C is provided between $T_l$ and $T_c$ and characteristic 216 is provided between $T_c$ and $T_h$. As a result, VCO 92 receives more clock pulses between times $T_c$ and $T_h$ when VCO 92 is less sensitive than between $T_l$ and $T_c$ to tend to compensate for the non-linearities of the frequency versus control voltage characteristic 184 (shown in FIG. 2A) of VCO 92. The calibrate mode is now complete.

MEASURING MODE

Characteristic 218 of FIG. 2C is formed by the combination of characteristics 214 and 216. After characteristic 218 of clock generator 56 has been initiated by MPU 130 then 218 repeats until a new calibration is requested. As an example, a band of received frequencies between 300 and 310 Megahertz (MHz) occurring at input terminal 14 of mixer 24 can be swept by VCO 92 providing frequencies between 280 to 290 MHz to provide a difference frequency of 20 MHz selected by narrowband filter 30. Assuming that CRT 52 of display 48 is triggered at time $T_l$ on axis 210 of FIG. 2C then the time from the triggering of the display and the occurrence of the received signal is a measure of the unknown frequency of the received signal.

Figure 3:
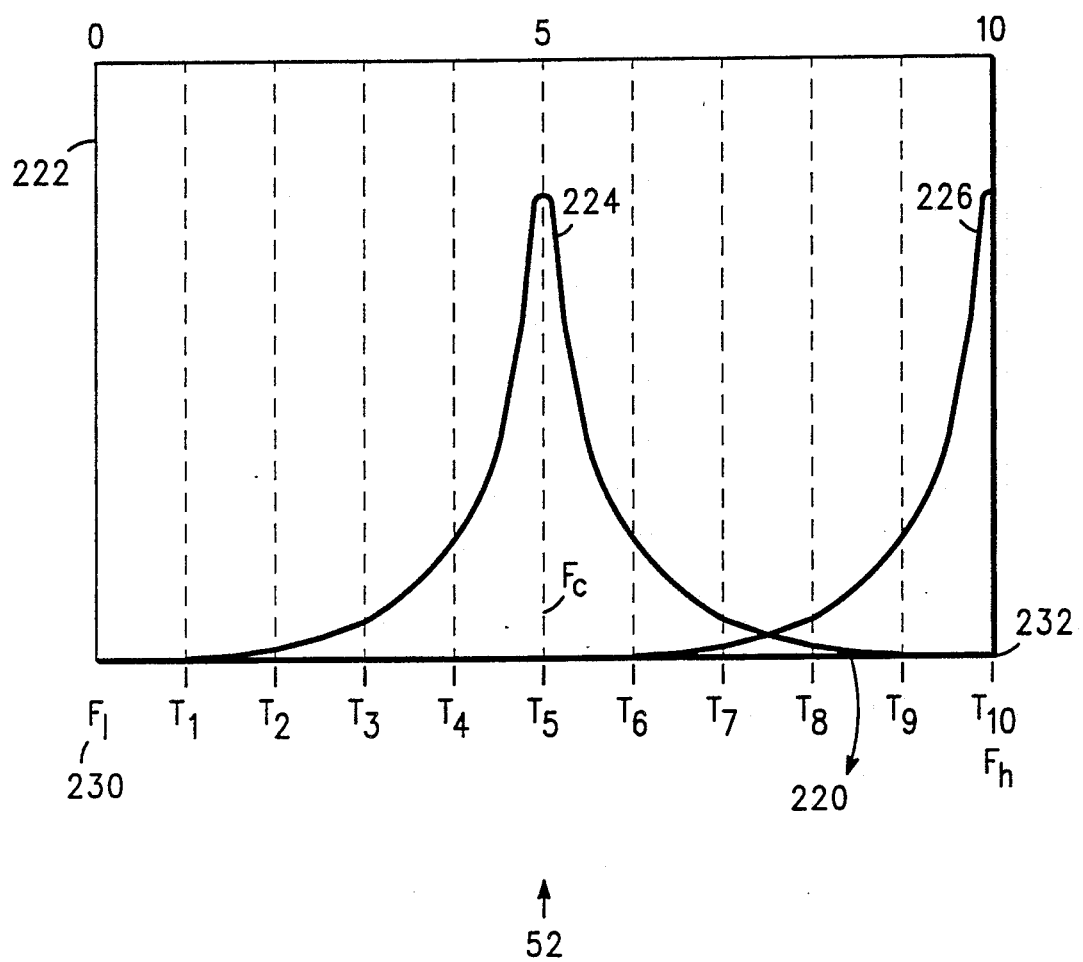
FIG. 3 is a view of a cathode ray display illustrating measurements of the frequency of a received signal.

More specifically, FIG. 3 shows an enlarged view of a portion of the screen of CRT 52. Abscissa axis 220 indicates frequency and ordinate axis 222 indicates power amplitude. A displayed waveform 224 shown at $T_5$ of abscissa 220 corresponds to a frequency of an unknown signal occurring at 305 MHz. Another signal centered at 310 MHz as indicated by waveform 226 can be tuned to the center of the scope by adjusting the manual adjustment of variable local oscillator 18, for instance.

In an actual implementation, 256 steps may be utilized for a complete sweep between $T_0$ and T end shown on axis 210 of FIG. 2C. In this case, $T_c$ is at 128 steps or counts, $T_l$ could occur at 28 counts and $T_h$ could occur at 228 counts. Accordingly, the number of counts between $T_l$ and $T_h$ would be 200. Counter 62 could be programmed to continuously change frequency to provide near perfect linearity, but it is only necessary to change the count twice, as described, over the cycle in order to meet many specifications.

By operator control of variable local oscillator 18, waveform 226 can be moved to the center of the display shown in FIG. 3. This is advantageous because it is known that the system is calibrated at the center frequency, $F_c$. Moreover, it is known that sweep generator system 55 is calibrated at the $F_l$ and $F_h$ frequencies respectively represented by reference numbers 230 and 232 of FIG. 3. Problems do not generally result from the calibration being slightly non-exact at points between $F_l$, $F_c$ and $F_h$. Linearization of the entire display would add cost and complexity to the system and perhaps create reliability problems. Since the linearization technique is controlled by software, it would be possible to linearize at each of ten increments. This would use up central processor time of MPU 130 and slow down system 55 and would be justified only if accuracy required. Moreover, when it is desired to expand a received waveform, the operator can tune the received waveform to the center region of interest so that waveform 224 of FIG. 3, for instance, can be expanded and the frequency components thereof displayed.

MPU 130 can also be programmed to enable display 48 to provide an alpha-numeric readout of the frequency of the received signal on CRT 52. Once the desired signal has been centered on the display, an operator can narrow or widen the IF bandwidth and the sweep of the spectrum analyzer. As mentioned, step attenuator 80 accommodates different sweep ranges. For example, available sweep ranges might be 10 MHz, 5 MHz, 2 MHz, 1 MHz, 0.5 MHz, 200 KHz, 100 KHz per division of the display of FIG. 3. Hence, an operator can change the display of FIG. 3 from 10 MHz per division to 1 MHz per division, for instance. As the frequency per division is reduced, the side band spectrum of the received signal will start to show up on display 52. Such displays are desired for ascertaining whether transmitters are operating properly and or for identifying the nature of an interfering signal, for instance. Vernier adjust 74 adjusts a number of counts between low frequency, $F_l$, and high frequency, $F_h$, to accommodate changes in sensitivity of the VCO's 92 from unit-to-unit. Adjust 74 is automatically self-aligning.

What has been described is a system 10 for indirectly predetermining the frequency of VCO 92 which can undesirably drift with time, etc. and which is nonlinear with respect to control voltages applied to control terminal 90. Calibration of the system can occur each time the scaling is changed by operation of frequency ranging block 178 of FIG. 1. Moreover, timing circuitry can be employed to alert the operator by a display on CRT 52 to manually recalibrate through block 170 when sufficient time has elapsed since the previous calibration. Also, an alert can be provided if the temperature changes more than 10 degrees, for instance. Recalibration is provided by determining the frequency of clock generator 56 at a particular value during a first time period between $T_l$ and $T_c$ and at another value between $T_c$ and $T_h$ as indicated by waveform 218 of FIG. 2C. Because the calibration and recalibration of circuitry 10 frequently occurs, system 10 tends to be accurate. Furthermore, since system 10 is automatically calibrating, it is not necessary to utilize expensive manual test techniques as is required by some prior art methodologies.

Circuitry 10 can be provided utilizing known reliable digital circuits and techniques which do not suffer from many of the vagaries associated with prior art analog compensation techniques. The calibration system and technique of circuit 10 utilizes circuits which are already required for performing other functions in spectrum analyzer 10. Therefore the aforedescribed linearization does not unduly increase the cost of an associated spectrum analyzer.

While the invention has been particularly shown and described with reference to a preferred embodiment, those skilled in the art will understand that changes in form and details may occur therein without departing from the scope of the present invention.

We claim:

1. Control circuitry for linearizing the output frequencies of a voltage controlled oscillator with time, including in combination:
   first control means selectively coupled to said voltage controlled oscillator, said first control means providing control voltages having selected magnitudes for operating the voltage controlled oscillator at predetermined frequencies within a band of frequencies, one of said predetermined frequencies being the center frequency of said band;
   measuring means coupled to said voltage controlled oscillator means, said measuring means determining said selected magnitudes of said control voltages;
   adjustable sweep means selectively coupled to said voltage controlled oscillator, said adjustable sweep means changing the magnitude of the control voltage for the voltage controlled oscillator at a selected frequency during a sweep cycle; and
   second control means having memory means, said memory means being coupled to said adjustable sweep means and to said voltage controlled oscillator, said memory means recording the times when the magnitudes of said control voltages reach said selected magnitudes for operating the voltage controlled oscillator at said predetermined frequencies, said second control means then selectively adjusting the frequency of said adjustable sweep means so that the output frequency range of the voltage controlled oscillator reaches said center frequency at a time midway through said sweep cycle so that the output frequencies of the voltage controlled oscillator tend to be predictable at given times during said sweep cycle.

2. The control circuitry of claim 1 wherein the voltage controlled oscillator has control and output terminals and said first control means comprising a phase locked loop including in combination:
- reference frequency oscillator means;
- detector means having first and second input terminals and an output terminal, said first input terminal being coupled to said reference frequency oscillator means;
- filter means having input and output terminals, said input terminal of said filter means being coupled to said output terminal of said detector means;
- switch means coupled between said output terminal of said filter means and a said control terminal of the voltage controlled oscillator;
- divide-by-N means wherein N is any indefinite number, said divide-by-N means having input, output and control terminals, said input terminal of said divide-by-N means being connected to said output terminal of said voltage controlled oscillator, and said output terminal of said divide-by-N means being connected to said input terminal of said detector means; and
- said first control means providing said control voltages having said selected magnitudes to operate the voltage controlled oscillator at said predetermined frequencies within a band of frequencies in response to further control signals applied to said control terminal of said divide-by-N means and which change the value of N of said divide-by-N means.

3. The control circuit of claim 2 further including:
- circuit means connecting said control terminal of said divide-by-N means to said second control means; and
- said second control means providing said further control signals to control said divide-by-N means.

4. The control circuitry of claim 1 wherein said measuring means includes an analog-to-digital converter coupled between the voltage controlled oscillator and said second control means.

5. The control circuitry of claim 1 wherein said adjustable sweep means includes in combination:
- variable clock generator means having a control terminal and an output terminal, said control terminal of said variable clock generator means being coupled to said second control means;
- counter means having an input terminal and an output terminal, said input terminal of said counter means being coupled to said output terminal of said variable clock generator means;
- digital-to-analog converter means having input, output and control terminals, said input terminal of said digital-to-analog converter means being coupled to said output terminal of said counter means, said control terminal of said digital-to-analog means being coupled to said second control means; and
- switch means coupled between said output terminal of said digital-to-analog converter means and the voltage controlled oscillator, said switch means selectively coupling said output terminal of said digital-to-analog converter means to the voltage controlled oscillator to control the frequency of the output signal of the voltage controlled oscillator.

6. The control circuitry of claim 1 and further including in combination:
- mixer means having an input terminal and an output terminal;
- signal supply means coupled to said input terminal of said mixer means;
- display means having an input terminal and a control terminal;
- first circuit means coupling said output terminal of said mixer means to said input terminal of said display means;
- second circuit means coupling said control terminal of said display means to said second control means; and
- said display means being responsive to a time of occurrence of a received signal from said mixing means relative to a beginning of said sweep cycle to determine the frequency of the received signal.

7. The control circuitry of claim 6 wherein said first circuit means includes narrowband filter means coupled between said mixer means and said display means.

8. The control circuitry of claim 1 wherein said second control means includes microprocessor means.

9. The control circuitry of claim 8 and further including read only memory means coupled to said microprocessor means, said microprocessor means also being coupled to said first control means; and
- said microprocessor means responding to data stored in said read only memory means for controlling the selected frequencies of operation of the voltage controlled oscillator.

10. The control circuitry of claim 9 and further including:
- calibrate initiation circuitry;
- frequency ranging circuitry; and
- said calibration and frequency ranging circuitry being selectively coupled to said microprocessor means.

11. A signal control method for linearizing the output frequencies of a voltage controlled oscillator with time, including the following steps:
- providing control voltages having magnitudes necessary to operate the voltage controlled oscillator at predetermined frequencies within a band of frequencies;
- measuring the selected magnitudes of said control voltages corresponding to said predetermined frequencies;
- changing the magnitudes of the control voltages for the voltage controlled oscillator at a selected frequency during a sweep cycle;
- recording times when the changing magnitudes of said control voltages reach reach said selected magnitudes for operating the voltage controlled oscillator at said predetermined frequencies; and
- selectively adjusting frequency of portions of said sweep so that the voltage controlled oscillator frequency reaches a center frequency within said band of frequencies at a time midway through said sweep cycle so that the frequencies of the voltage controlled oscillator tend to have a characteristic that is predictable at any given time during said sweep cycle.

12. The signal control method of claim 11 and further including:
- mixing said output signal of said voltage controlled oscillator having said selected characteristic with a received signal;
- initiating a display trace at the beginning of said sweep cycle; and
- determining the frequency of said received signal in accordance with the time it occurs from the beginning of said sweep cycle.

13. Sweep linearization circuitry for controlling the output frequency of a voltage controlled oscillator with time, including in combination:
  switch means having first and second operating positions;
  controllable phase locked loop means adapted to be selectively coupled through said switch means to the voltage controlled oscillator;
  variable sweep clock generator means adapted to be selectively coupled through said switch means to the voltage controlled oscillator;
  analog-to-digital converter means coupled to the voltage controlled oscillator means;
  microprocessor means coupled to said switch means, to said controllable phase locked loop means, to said variable sweep clock generator means and to said analog-to-digital converter means; and
  said microprocessor means being programmed to calibrate the sweep linearization circuitry by causing said phase locked loop means to operate said voltage controlled oscillator at predetermined frequencies; said microprocessor means recording the magnitudes of the control voltages as measured by said analog-to-digital converter at each of said predetermined frequencies; said microprocessor means initiating said variable sweep clock generator to sweep said voltage controlled oscillator at a selected frequency and recording the times at which said predetermined magnitudes of said control voltages are reached; said microprocessor selectively adjusting the frequency of said adjustable sweep means during portions of a sweep cycle so that the frequency of the output of the voltage controlled oscillator reaches at least one of said predetermined frequencies at a selected point through said sweep cycle so that the frequencies of the output signals of the voltage controlled oscillator tend to be predictable at any given time during said sweep cycle.

14. The sweep linearization circuitry of claim 13, further including:
  a mixer coupled to receive the output of said voltage controlled oscillator, said mixer further being coupled to receive an incoming signal; and
  display means;
  circuit means coupling said display means to said mixer means and to said microprocessor means, said microprocessor means triggering said display at the beginning of said sweep cycle so that the frequency of said received signal can be determined from said display according to the time of its occurrence after the initiation of said sweep.

15. The sweep linearization circuitry of claim 14 wherein said circuit means includes a filter.

16. The sweep linearization circuitry of claim 13 wherein:
  said predetermined frequencies include a low frequency, a center frequency and a high frequency.

17. The sweep linearization circuitry of claim 16 wherein:
  said at least one of said predetermined frequencies is said center frequency and said selected point is midway through said sweep cycle.

* * * * *